(12) United States Patent
Kuriyama

(10) Patent No.: US 7,034,347 B2
(45) Date of Patent: Apr. 25, 2006

(54) CHARGE DETECTING DEVICE

(75) Inventor: Toshihiro Kuriyama, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 10/793,107

(22) Filed: Mar. 3, 2004

(65) Prior Publication Data

US 2004/0183109 A1 Sep. 23, 2004

(30) Foreign Application Priority Data

Mar. 6, 2003 (JP) .............................. 2003-060529
Feb. 17, 2004 (JP) .............................. 2004-040450

(51) Int. Cl.
*H01L 31/062* (2006.01)
*H01L 31/113* (2006.01)
*H01L 31/06* (2006.01)

(52) U.S. Cl. ...................... 257/292; 257/239; 257/386; 257/462; 257/463

(58) Field of Classification Search ................ 257/237, 257/290, 291, 292, 386
See application file for complete search history.

(56) References Cited

U.S. PATENT DOCUMENTS

| | | | | |
|---|---|---|---|---|
| 5,977,576 A | * | 11/1999 | Hamasaki | .................... 257/292 |
| 6,084,259 A | * | 7/2000 | Kwon et al. | ................. 257/292 |
| 2001/0054726 A1 | * | 12/2001 | Abe | ........................... 257/292 |

FOREIGN PATENT DOCUMENTS

| | | |
|---|---|---|
| JP | 9-232555 | 9/1997 |
| JP | 2000-82839 | 3/2000 |
| JP | 2000-91550 | 3/2000 |

* cited by examiner

*Primary Examiner*—Zandra V. Smith
*Assistant Examiner*—Tsz K Chiu
(74) *Attorney, Agent, or Firm*—Hamre, Schumann, Mueller & Larson, P.C.

(57) ABSTRACT

There is provided a charge detecting device that can convert an accumulated charge to a voltage at a low voltage and a high efficiency, and has a large dynamic range of an output voltage and satisfactory linearity of a conversion efficiency. The charge detecting device includes a charge accumulating portion including a low concentration N-type (N−) layer 108 formed in a P-type well 101 and a high concentration N-type (N+) layer formed between the N− layer and a principal surface. The N+ layer is connected to an input terminal of an amplifying transistor of an output circuit, and after a reverse bias is applied to the N+ layer during discharging of the accumulated charge, the entire N− layer is depleted at least until a saturated charge is accumulated.

12 Claims, 3 Drawing Sheets

CHARGE DETECTING DEVICE

BACKGROUND OF THE INVENTION

1. Field of the Invention

The present invention relates to a charge detecting device applied to a solid-state imaging apparatus such as a charge-coupled device (CCD) sensor, a complementary metal oxide semiconductor (CMOS) sensor, and the like.

2. Description of the Related Art

Typical examples of a solid-state imaging apparatus include a CCD sensor composed of a photodiode and a CCD shift register, and a CMOS sensor such as an active pixel sensor (APS) composed of a photodiode and a MOS transistor.

The APS includes a photodiode, a MOS switch, an amplifier for amplifying a signal from the photodiode, and the like on a pixel basis, and has a number of merits of enabling "XY addressing", "integrating a sensor and a signal processing circuit into one chip", etc. However, on the other hand, the APS has problems of a small pixel opening ratio and difficulty in reducing a chip size that determines the size of an optical system, due to the large number of elements per pixel. Thus, CCD sensors occupy a large part of the market.

Recently, due to the enhancement of a miniaturization technique of a MOS transistor and the increasing demand for "integrating a sensor and a signal processing circuit into one chip" and "reducing power consumption", the APS is drawing attention.

FIG. 4A is a view showing a cross-sectional configuration of a semiconductor and a configuration of an output circuit of a photoelectric converter in a conventional APS (e.g., see JP 9(1997)-232555 A). The configuration of this conventional example will be described briefly below. In FIG. 4A, the photoelectric converter (photodiode) is of a PN junction type in which an N(N+) layer 402 is formed on the surface of a so-called P-type semiconductor substrate 401, and is composed of a diffusion floating region that also functions as a charge accumulating portion. Reference numeral 403 denotes a reset MOS transistor for resetting the diffusion floating region to a predetermined voltage (supply voltage VCC) in accordance with a reset control signal applied to a reset electrode 404; 405 denotes an amplifying MOS transistor (source follower circuit) for amplifying a voltage in the diffusion floating region; 406 denotes a row-selecting MOS transistor; and 407 denotes an output terminal. In FIG. 4A, broken lines represent the ends of a depletion layer.

Next, the outline of an operation of the photodiode thus configured will be described. The diffusion floating region previously is reset to a predetermined voltage (supply voltage VCC). When light is incident upon the photodiode, electrons generated by photoelectric conversion are accumulated in an N-layer 402 of the photodiode. An accumulated charge Q is converted to a voltage by a capacitance Cfd in the diffusion floating region, and the voltage in the diffusion floating region is decreased by a voltage corresponding to Q/Cfd from the reset voltage. This change in voltage is output from the output terminal 407 via the amplifying MOS transistor 405 and the row-selecting MOS transistor 406 in the case where the reset MOS transistor 403 is in an OFF state, and the row-selecting MOS transistor 406 is in an ON state.

However, in the configuration of the conventional example, the capacitance Cfd in the diffusion floating region corresponding to a charge/voltage converting portion is increased when the impurity concentration of the P-type semiconductor substrate (P-type well) 401 is increased with the miniaturization of a MOS transistor. Therefore, there is a problem that a conversion efficiency (Q/Cfd) is decreased, and an output voltage is lowered.

FIG. 4B is a graph showing the voltage dependency of the capacitance Cfd in the floating diffusion region. A horizontal axis represents an applied voltage V, and a vertical axis represents the capacitance Cfd. In FIG. 4B, during reset, the applied voltage is close to the supply voltage VCC, and a signal is not output from the output terminal 407.

As is understood from FIG. 4B, when the applied voltage V is increased, the capacitance Cfd can be reduced, and the conversion efficiency (Q/Cfd) can be enhanced. However, the increase in the applied voltage V results in an increase in the supply voltage VCC. This contradicts the decrease in voltage that is required in a miniaturized MOS transistor, which makes it impossible to satisfy transistor characteristics.

Furthermore, when a usable range ΔCfd of the capacitance Cfd is defined so as to suppress a change in a conversion efficiency, which is involved in a change in the applied voltage V, in a predetermined range, the dynamic range of an output voltage becomes narrow. In contrast, when it is attempted to keep a predetermined dynamic range, a change amount of the capacitance Cfd with respect to the change in the applied voltage V is large, and the output voltage fluctuates greatly with respect to a signal charge amount. More specifically, the linearity of a conversion efficiency is degraded.

SUMMARY OF THE INVENTION

Therefore, with the foregoing in mind, it is an object of the present invention to provide a charge detecting device that can convert an accumulated charge to a voltage at a low voltage and a high efficiency, and has a large dynamic range of an output voltage and satisfactory linearity of a conversion efficiency.

In order to achieve the above-mentioned object, a charge detecting device according to the present invention includes a charge accumulating portion that includes a first region (P-type well) of a first conductivity (P-type) formed on a semiconductor substrate, including one principal surface, a second region (N− layer) of a second conductivity (N-type) formed in the first region, and a third region (N+ layer) of the second conductivity (N-type) formed between the second region and the principal surface. The third region of the charge accumulating portion is connected to an input terminal of an output circuit, and the entire second region is depleted after a reset voltage for discharging an accumulated charge accumulated in the charge accumulating portion is applied to the third region.

Furthermore, a charge detecting device according to the present invention includes a charge accumulating portion that includes a first region (P-type well) of a first conductivity (P-type) formed on a semiconductor substrate, including one principal surface, a second region (N− layer) of a second conductivity (N-type) formed in the first region, and a third region (N+ layer) of the second conductivity (N-type) formed between the second region and the principal surface. The third region of the charge accumulating portion is connected to an input terminal of an output circuit, and the entire second region is depleted immediately after a reset voltage for discharging an accumulated charge accumulated in the charge accumulating portion is applied to the third region.

According to the above configuration, even when a supply voltage is lowered, a charge can be converted to a voltage with a high conversion efficiency, i.e., a high conversion efficiency can be maintained in a large dynamic range.

It is preferable that the second region is depleted in a period from a time immediately after the reset voltage is applied at least to a time when a saturated charge is accumulated. According to this, the linearity characteristics can be made satisfactory by suppressing the fluctuation in a diffusion floating capacitance in the charge accumulating portion, and a large dynamic range can be maintained.

Furthermore, in the charge detecting device according to the present invention, it is preferable that an impurity concentration of the second region is lower than that of the third region.

Furthermore, in the charge detecting device according to the present invention, it is preferable that the second region includes a plurality of regions of the same conductivity, and an impurity concentration of a region on a surface side is lower than that of a region placed in a deeper portion with respect to the region on the surface side.

Furthermore, in the charge detecting device according to the present invention, it is preferable that an area of the third region on the principal surface is equal to or larger than an area of a portion where the second region contacts the third region.

Furthermore, it is preferable that an impurity concentration of the second region is $2.0 \times 10^{16}$ cm$^{-3}$ or less.

According to the present invention, a charge detecting device can be provided, which can convert a charge accumulated in a photodiode in a solid-state imaging apparatus at a low voltage and a high efficiency, and has a large dynamic range of an output voltage and satisfactory linearity of a conversion efficiency, due to the small dependency of the conversion efficiency on an accumulated charge amount.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of preferred examples with reference to the drawings.

EXAMPLE 1

Figure 1A:
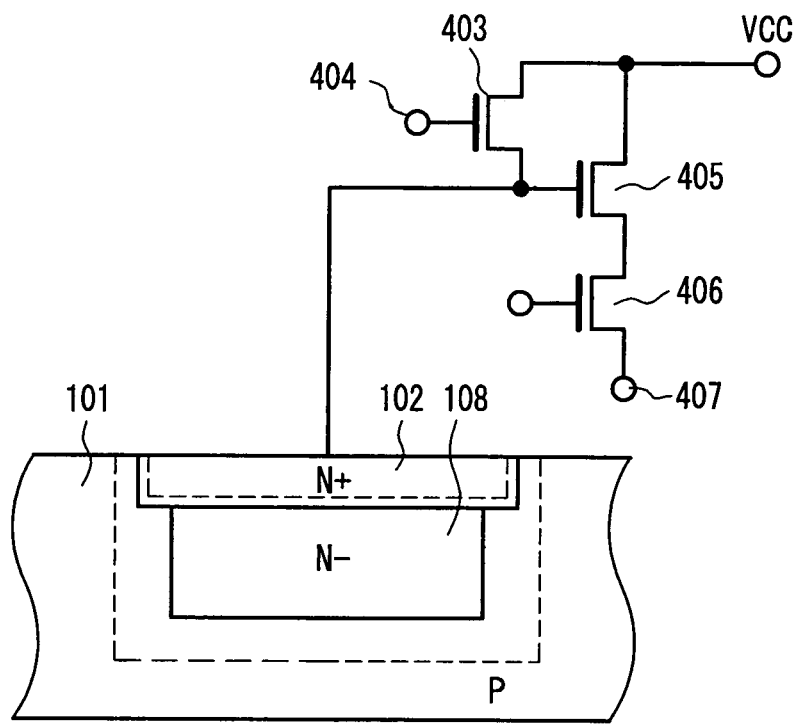
FIG. 1A is a view showing a cross-sectional configuration of a semiconductor of a photoelectric converter and a configuration of an output circuit in a charge detecting device according to Example 1 of the present invention.
Figure 4A:
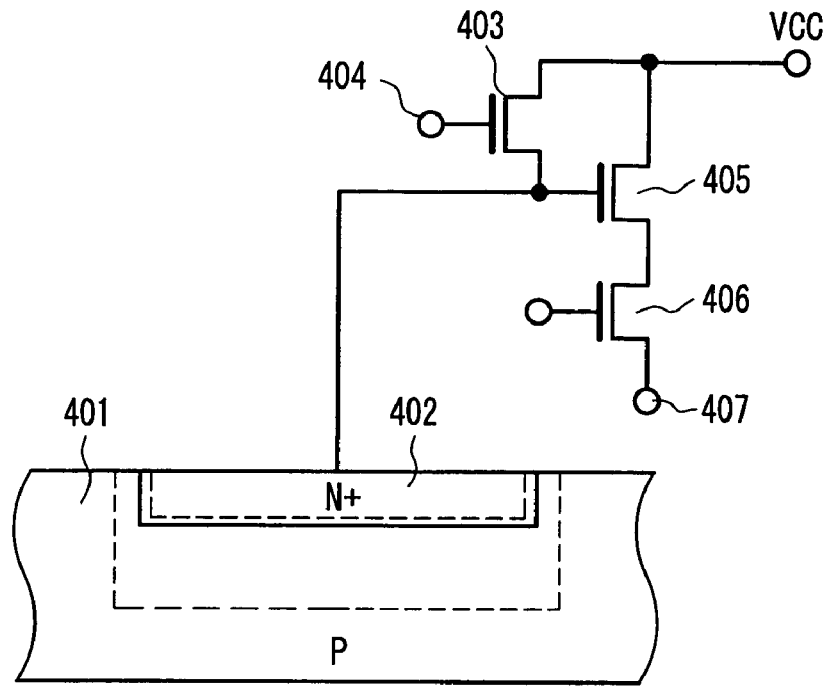
FIG. 4A is a view showing a cross-sectional configuration of a semiconductor of a photoelectric converter and a configuration of an output circuit in a conventional charge detecting device.
Figure 4B:
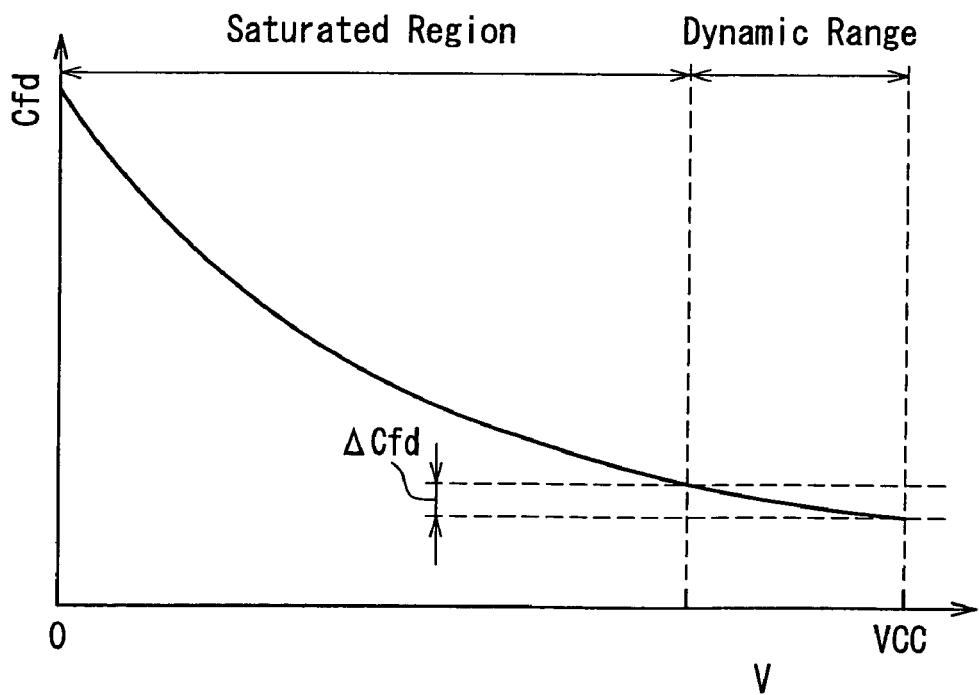
FIG. 4B is a graph showing voltage dependency of a capacitance Cfd in a diffusion floating region in the configuration shown in FIG. 4A.

FIG. 1A is a view showing a cross-sectional configuration of a semiconductor of a photoelectric converter and a configuration of an output circuit in a charge detecting device according to Example 1 of the present invention. In FIG. 1A, portions having the same configurations and functions as those in FIG. 4A referred to in the description of the conventional example are denoted with the same reference numerals as those therein, and their description will be omitted here. In FIG. 1A, broken lines represent the ends of a depletion layer.

The photoelectric converter is configured in such a manner that an N-layer 108 of a photodiode is formed on a P-type semiconductor substrate (or a P-type well) 101, and an N-layer 102 of the photodiode is formed on the N-layer 108 so that the surface has a high impurity concentration. The photoelectric converter also functions as a diffusion floating region that also works as a charge accumulating portion. The photoelectric converter is connected to a gate of an amplifying MOS transistor 405 of an output circuit. A drain of the amplifying MOS transistor 405 is supplied with a supply voltage VCC, and a source thereof is connected to a row-selecting MOS transistor 406. A source of the row-selecting MOS transistor 406 is connected to a current source (not shown) to be a load of the amplifying MOS transistor 405. Thus, a source follower amplifier is provided.

A production method of Example 1 will be described briefly. On the P-type semiconductor substrate (or the P-type well) 101, the high concentration N-layer (N+) 102 on a surface is formed by implanting arsenic ions with a concentration of $4.0 \times 10^{14}$ cm$^{-2}$ at an energy of 10 keV, and the low concentration N-layer (N-) 108 on a surface side is formed by implanting arsenic ions with a concentration of $1.0 \times 10^{12}$ cm$^{-2}$ at an energy of 1000 keV.

At this time, as shown in FIG. 1A, a region of the N-layer 102 is set to be equal to or wider than that of the N-layer 108 at a portion where the N-layers 102 and 108 contact each other, whereby the impurity concentration of the N-layer in the vicinity of the substrate surface can be kept high. Therefore, the spread of a depletion layer region in the vicinity of the substrate surface between the P-type semiconductor substrate 101 and the N-layer (102, 108) of the photodiode is suppressed, whereby a dark current generated in the vicinity of the substrate surface where an interface level is high can be suppressed.

Then, a desired heat treatment is conducted, and a gate oxide film is formed to a thickness of 5 nm over the entire substrate surface by thermal oxidation. Thereafter, a control electrode of each MOS transistor is formed. Then, sources and drains are formed. An interlayer film is grown, and contact holes are formed. Thereafter, wiring is performed.

Furthermore, the source of the reset MOS transistor 403 for resetting an accumulated charge in the diffusion floating region is connected to the photoelectric converter that functions as the diffusion floating region, and the drain thereof is supplied with the supply voltage VCC.

Next, a read operation in the charge detecting device thus configured will be described so as to clarify the advantages of the present example.

Previously, by turning on the reset MOS transistor 403, the diffusion floating region is reset to a voltage (reset voltage) dose to the supply voltage VCC. When light is incident the photodetector, electrons generated by photoelectric conversion are accumulated in the N-layer 108 of the photodiode. The accumulated charge Q is converted to a voltage by the diffusion floating capacitance Cfd, and the voltage of the diffusion floating region is lowered by a voltage of Q/Cfd from the reset voltage. If the accumulation layer of the photodiode is of a P-type, a transfer charge is a hole, so that the voltage is increased.

The diffusion floating region is composed of a PN junction. When a reset voltage is applied to the diffusion floating region, the diffusion floating region is placed in a reverse-bias voltage state, and the diffusion floating capacitance Cfd is determined by the width of the depletion layer at this time. In order to decrease the diffusion floating capacitance Cfd, and increase a charge/voltage conversion efficiency, it is necessary to enlarge the width of the depletion layer.

The feature of the present example lies in that most of the regions are depleted until a saturated charge is accumulated in the diffusion floating region. Based on this, the inventors of the present invention have found that there are the following two advantages.

Figure 1B:
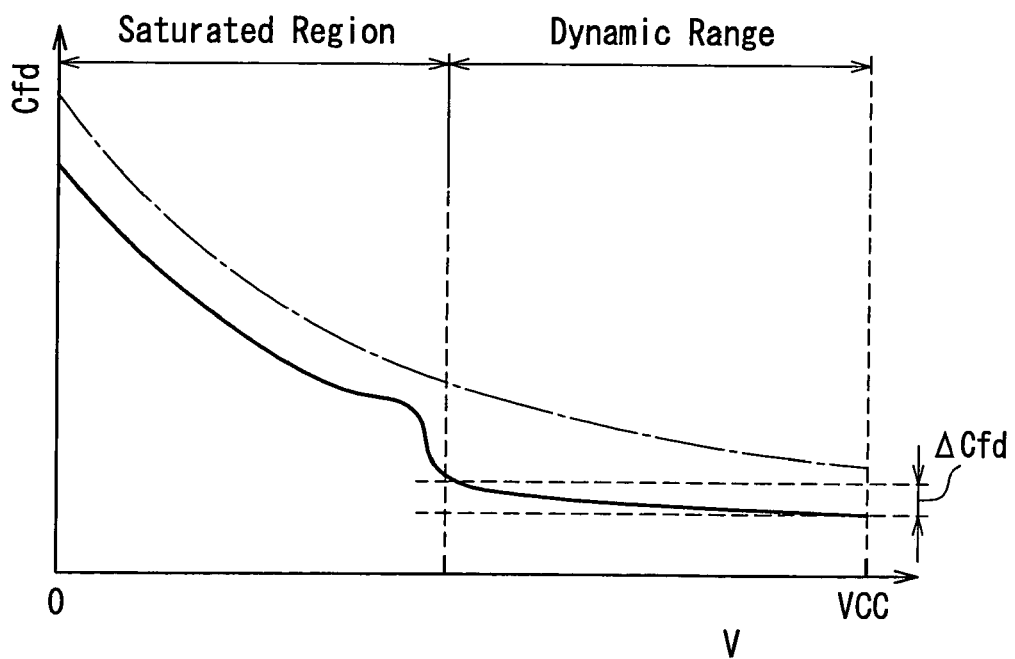
FIG. 1B is a graph showing voltage dependency of a capacitance Cfd in a diffusion floating region in the configuration shown in FIG. 1A.

Herein, referring to FIG. 1B, two advantages of the present example will be described. FIG. 1B is a graph showing the voltage dependency of the capacitance Cfd in the diffusion floating region composed of the high concentration N-layer (N+ layer) 102 on the surface and the low-concentration N-layer (N− layer) 108 placed thereunder. In FIG. 1B, an alternate long and short dash line represents the voltage dependency of the capacitance Cfd in the conventional example.

As is understood from FIG. 1B, the first advantage lies in that the capacitance Cfd in a region where the applied voltage is in the vicinity of zero can be reduced, compared with the conventional example. When the applied voltage V is increased, there is an inflection point where the capacitance Cfd is decreased rapidly. In this state, a part of the high concentration N-layer (N+ layer) 102 on the surface and the low concentration N-layer (N− layer) 108 are almost (90% or more) depleted. When a voltage is increased further, the N-layers 102 and 108 are depleted further, whereby the capacitance Cfd is decreased little by little. At least immediately after resetting, the entire low concentration N-layer (N− layer) 108 is depleted. This is the second advantage. According to this advantage, the change amount of the capacitance Cfd with respect to the change in the applied voltage V is smaller compared with that in the conventional example. This shows that the output voltage with respect to the signal charge amount is fluctuated less, i.e., the linearity of a conversion efficiency is satisfactory, and charge can be accumulated (saturated charge amount) until this region. Furthermore, this shows that the dynamic range of an output voltage is large, in the case where a usable range ΔCfd of the capacitance Cfd is set to be the same as that in the conventional example.

In a supply voltage of 3.3 V generally used in a MOS sensor, if the impurity concentration of the low concentration N-layer (N− layer) 108 is set to be $2.0 \times 10^{16}$ cm$^{-3}$ or less, most of the regions can be depleted until the saturated charge amount is accumulated as described above.

EXAMPLE 2

Figure 2:
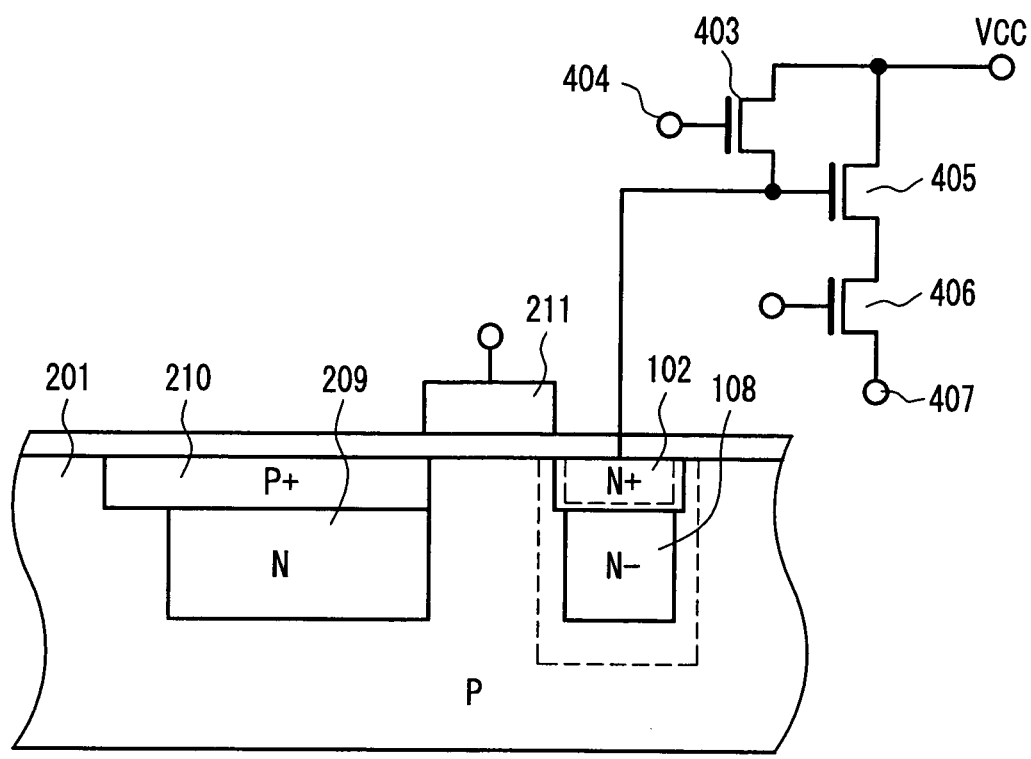
FIG. 2 is a view showing a cross-sectional configuration of a semiconductor and a configuration of an output circuit in the case where the charge detecting device of Example 1 is applied to a CCD sensor as a solid-state imaging apparatus according to Example 2 of the present invention.

FIG. 2 shows a cross-sectional configuration of a semiconductor and a configuration of an output circuit in the case where the charge detecting device of Example 1 is applied to a CCD sensor as a solid-state imaging apparatus according to Example 2 of the present invention. In FIG. 2, the portions having the same configurations and functions as those in FIG. 1A referred to in the description of Example 1 are denoted with the same reference numerals as those therein, and their description will be omitted. In FIG. 2, broken lines represent the ends of a depletion layer.

In FIG. 2, a buried-type photodiode is used, in which the surface of an N-layer 209 of a photodiode that is used generally in a CCD sensor is formed of a high concentration P-layer (P+ layer) 210. A charge/voltage converting portion with high sensitivity at a low voltage according to Example 1 is connected to an output circuit via a read gate 211 interposed therebetween. In this example, a signal charge is accumulated in the buried photodiode, and by turning on the reset MOS transistor 403 before turning on the read gate 211, the diffusion floating region is reset to a voltage (reset voltage) in the vicinity of a supply voltage VCC. Thereafter, by turning on the read gate 211, the charge is transferred to the diffusion floating region that is the charge/voltage converting portion. The subsequent procedure is the same as that in Example 1.

EXAMPLE 3

Figure 3:
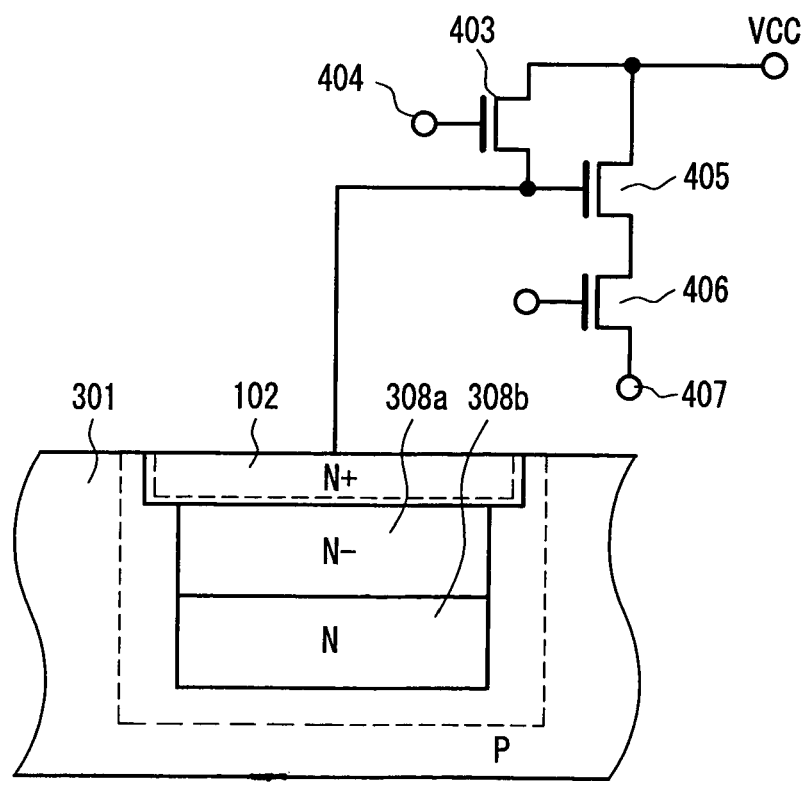
FIG. 3 is a view showing a cross-sectional configuration of a semiconductor and a configuration of an output circuit of a photoelectric converter in a charge detecting device according to Example 3 of the present invention.

FIG. 3 shows a cross-sectional configuration of a semiconductor and a configuration of an output circuit of a photoelectric converter in a charge detecting device according to Example 3 of the present invention. In FIG. 3, portions having the same configurations and functions as those in FIG. 1A referred to in the description of Example 1 are denoted with the same reference numerals as those therein, and their description will be omitted here. In FIG. 3, broken lines represent the ends of a depletion layer.

The present example is obtained by further improving the configuration of Example 1, and is the most important and preferable example of a low concentration N-layer region in the present invention. The low concentration N-layer region is composed of two regions. A low concentration N-layer region (N−) 308a on a surface side is formed so as to have an impurity concentration lower than that of a low concentration N-layer region (N) 308b in a deep portion. The reason for forming in this manner is as follows. The N-layer region on a surface side is depleted last, and is unlikely to be depleted due to its structure. By setting the impurity concentration of the low concentration N-layer region 308a on a surface side to be lower by about one order of magnitude than that of the low concentration N-layer region 308b in a deep portion, the low concentration N-layer region 308a is made likely to be depleted. This can further enhance the advantages of the present example.

In each of the above-mentioned examples, the case where electrons are accumulated has been described. However, the present invention is not limited to the case where holes are accumulated, accumulated charge, and the type of a transfer MOS transistor. For example, if the present invention is applied to a floating diffusion amplifier of a CCD solid-state imaging apparatus, it is apparent that the same effects as described above can be obtained.

In the present example, the low concentration N-layer region is composed of two regions. However, even when the low concentration N-layer region is composed of a plurality of regions, and the impurity concentration of the low concentration N-layer region (N−) on a surface side is set to be lower than that of the low concentration N-layer region in a deep portion, the same effects can be obtained.

Hereinafter, a method for producing a charge detecting device according to the present invention will be described with reference to FIG. 3. The charge detecting device and the solid-state imaging apparatus of the present example are formed in the following procedure.

On a P-type substrate (or a P-type well) 301, a high concentration N-layer (N+) 102 on a surface is formed by implanting arsenic ions with a concentration of $4.0 \times 10^{14}$ cm$^{-2}$ at an energy of 10 keV, a low concentration N-layer (N−) 308a on a surface side is formed by implanting arsenic ions with a concentration of $3.0 \times 10^{11}$ cm$^{-2}$ at an energy of 600 keV, and a low concentration N-layer (N) 308b in a deep portion is formed by implanting arsenic ions with a concentration of $1.0 \times 10^{12}$ cm$^{-2}$ at an energy of 1200 keV. Then, a heat treatment is conducted, and a gate oxide film is formed to a thickness of 5 nm over the entire substrate surface by thermal oxidation, whereby a control electrode of each MOS transistor is formed. Then, sources and drains are formed. An interlayer film is grown, and contact holes are formed. Thereafter, wiring is performed.

The charge detecting device according to the present invention can convert an accumulated charge to a voltage at a low voltage and a high efficiency, and has a large dynamic range of an output voltage and satisfactory linearity of a conversion efficiency. Thus, the charge detecting device is useful for an amplifying type solid-state imaging apparatus such as a CCD solid-state imaging apparatus and a MOS sensor.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A charge detecting device comprising a charge accumulating portion that includes a first region of a first conductivity formed on a semiconductor substrate, including one principal surface, a second region of a second conductivity formed in the first region, and a third region of the second conductivity formed between the second region and the principal surface, wherein the second region includes a plurality of regions of the same conductivity, and an impurity concentration of a region on a surface side is lower than that of a region placed in a deeper portion with respect to the region on the surface side, and wherein the third region is connected to an input terminal of an output circuit, and the entire second region is depleted after a reset voltage is applied to the third region, said reset voltage discharging an accumulated charge accumulated in the charge accumulating portion.

2. The charge detecting device according to claim 1, wherein an impurity concentration of the second region is lower than that of the third region.

3. The charge detecting device according to claim 1, wherein an area of the third region on the principal surface is equal to or larger than an area of a portion where the second region contacts the third region.

4. The charge detecting device according to claim 1, wherein an impurity concentration of the second region is $2.0 \times 10^{16}$ cm$^{-3}$ or less.

5. An active pixel type image sensor comprising a charge detecting device according to claim 1.

6. A CCD type image sensor comprising a charge detecting device according to claim 1.

7. The CCD type image sensor according to claim 6, wherein the charge detecting device is used as a floating diffusion amplifier.

8. A charge detecting device comprising a charge accumulating portion that includes a first region of a first conductivity formed on a semiconductor substrate, including one principal surface, a second region of a second conductivity formed in the first region, and a third region of the second conductivity formed between the second region and the principal surface, wherein the second region includes a plurality of regions of the same conductivity, and an impurity concentration of a region on a surface side is lower than that of a region placed in a deeper portion with respect to the region on the surface side, and wherein the third region is connected to an input terminal of an output circuit, and the entire second region is depleted immediately after a reset voltage is applied to the third region, said reset voltage for discharging an accumulated charge accumulated in the charge accumulating portion.

9. The charge detecting device according to claim 8, wherein the second region is depleted in a period from a time immediately after the reset voltage is applied at least to a time when a saturated charge is accumulated.

10. The charge detecting device according to claim 8, wherein an impurity concentration of the second region is lower than that of the third region.

11. The charge detecting device according to claim 8, wherein an area of the third region on the principal surface is equal to or larger than an area of a portion where the second region contacts the third region.

12. The charge detecting device according to claim 8, wherein an impurity concentration of the second region is equal to or less than $2.0 \times 10^{16}$ cm$^{-3}$.

* * * * *